(12) United States Patent
Arvin et al.

(10) Patent No.: US 11,121,101 B2
(45) Date of Patent: Sep. 14, 2021

(54) FLIP CHIP PACKAGING REWORK

(71) Applicant: International Business Machines Corporation, Armonk, NY (US)

(72) Inventors: Charles Leon Arvin, Poughkeepsie, NY (US); Karen P. McLaughlin, Poughkeepsie, NY (US); Thomas Anthony Wassick, LaGrangeville, NY (US); Brian W. Quinlan, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/777,169

(22) Filed: Jan. 30, 2020

(65) Prior Publication Data
US 2021/0242146 A1 Aug. 5, 2021

(51) Int. Cl.
*H01L 21/00* (2006.01)
*H01L 23/00* (2006.01)

(52) U.S. Cl.
CPC .............. *H01L 24/03* (2013.01); *H01L 24/05* (2013.01); *H01L 24/11* (2013.01); *H01L 2224/0345* (2013.01); *H01L 2224/0346* (2013.01); *H01L 2224/0362* (2013.01); *H01L 2224/0381* (2013.01); *H01L 2224/0391* (2013.01); *H01L 2224/03614* (2013.01); *H01L 2224/03622* (2013.01); *H01L 2224/0401* (2013.01); *H01L 2224/0569* (2013.01); *H01L 2224/05584* (2013.01); *H01L 2224/05647* (2013.01); *H01L 2224/05655* (2013.01); *H01L 2224/05666* (2013.01); *H01L 2224/05684* (2013.01); *H01L 2924/07025* (2013.01)

(58) Field of Classification Search
USPC ............................................. 438/4
See application file for complete search history.

(56) References Cited

U.S. PATENT DOCUMENTS

| 6,319,846 | B1 | 11/2001 | Lin et al. | |
|---|---|---|---|---|
| 6,426,281 | B1 * | 7/2002 | Lin | ............... H01L 24/11 257/E21.508 |
| 8,227,264 | B2 | 7/2012 | Andry et al. | |
| 9,508,680 | B1 | 11/2016 | Ayotte et al. | |

(Continued)

FOREIGN PATENT DOCUMENTS

CN 105609434 A 5/2016

OTHER PUBLICATIONS

Disclosed Anonymously, "Method for a reworkable assembly process for flip-chip devices," IPCOM000145769D; Jan. 26, 2007, (9 pages).

(Continued)

*Primary Examiner* — Niki H Nguyen
(74) *Attorney, Agent, or Firm* — Cantor Colburn LLP; L. Jeffrey Kelly

(57) ABSTRACT

Rework and recovery processes generally include application of liquid metal etchant compositions to selectively remove one layer at a time of a solder layer and underball metallurgy multilayer stack including a titanium-based adhesion layer, a copper seed layer, a plated copper conductor layer, and a nickel-based barrier layer. The rework and recovery process can be applied to the dies, wafers, and/or substrate.

20 Claims, 2 Drawing Sheets

(56) References Cited

U.S. PATENT DOCUMENTS

| | | |
|---|---|---|
| 10,002,846 B2 | 6/2018 | Spory |
| 2002/0137304 A1 | 9/2002 | Yih et al. |
| 2012/0261608 A1* | 10/2012 | Hosomi .................. C23F 1/44 252/79.1 |
| 2016/0197022 A1 | 7/2016 | Pagaila et al. |
| 2018/0182672 A1 | 6/2018 | Dang et al. |

OTHER PUBLICATIONS

Erickson, et al. "Flip Chip Solder Ball Rework Process" IBM TDB 11-82, p. 2779-2781:IPCOM000050493D; Feb. 10, 2005, (4 pages).

* cited by examiner

FLIP CHIP PACKAGING REWORK

BACKGROUND

The present invention generally relates to flip chip packaging structures, and more particularly, to reworking of dies or wafers or substrate from the flip chip packaging structures for recovery and repair as needed.

Flip chip is an advanced semiconductor interconnection technology that is also referred to as Controlled Collapse Chip Connection (C4). In this interconnection technology, a chip or die is flipped face down and bonded to a substrate with various interconnection materials. The technology is applicable to either single-chip packages or multiple-chip modules. In flip chip attachment, solder bumps deposited on the chip or die are used for electrical interconnection between the chip or an integrated circuit and a substrate. The substrate can be a silicon or ceramic or glass or printed circuit board (PCB) or some material composition substrate. When a chip or die with solder bumps is aligned to attach to a substrate, a reflow process of high temperature is performed to melt solder bumps and form the solder joints between the chips or dies and the substrate, which provides the electrical interconnection and the mechanical bonds between the chip and the substrate. There are many advantages that the flip chip provides, such as the shortest possible leads, lowest inductance, highest frequency, best noise control, highest density, greatest number of I/Os, smallest device footprints, and lowest profile.

SUMMARY

Embodiments of the present invention are generally directed to integrated circuit packaging structures and methods for forming the packaging structures. A non-limiting example according to embodiments of the invention includes a process for reworking and recovering a die for a flip chip application. The process includes providing the die including a plurality of under-bump metallurgy (UBM) stacks on a substrate, wherein each of the UBM stacks is in contact with a first bond pad and is formed in a trench to the first bond pad defined by a passivation layer and a polyimide layer. Each of the UBM stacks includes a sputtered adhesion layer including a seed layer thereon, a plated conductive layer, and a barrier layer; and solder in direct contact with the UBM stacks, wherein an intermetallic forms at an interface between each of the UBM stacks and the solder. A liquid etchant is applied to selectively remove one layer at a time of each of the solder, the barrier layer, conductive layer, and the adhesion layer. The polyimide layer is removed and a nitride layer is deposited. A photosensitive polyimide layer is deposited and patterned to expose the first bond pad. A redistribution layer is deposited and patterned extending from the first bond pad to a second bond pad at a different location. A passivation layer is deposited and patterned to expose the second bond pad. A second UBM stack and a second solder ball thereon is formed on the second bond.

A non-limiting example according to embodiments of the invention includes a process for reworking and recovering a substrate for a flip chip application. The process includes applying a liquid etchant to selectively remove solder from the substrate. A solder mask and a copper short are then removed. A solder mask is applied and patterned. The substrate is cured and the solder mask exposed to an oxygen plasma ash process to roughen a surface thereof. The solder is reapplied to the substrate.

A non-limiting example process according to embodiments of the invention includes a process for reworking and recovering a wafer for a flip chip application. The process includes providing the wafer including a plurality of under-bump metallurgy (UBM) stacks, wherein each of the UBM stacks is in contact with a bond pad and is formed in a trench opening in a passivation layer and a polyimide layer to the bond pad. Each of the UBM stacks includes a titanium-based adhesion layer, a copper-based conductive layer, a sputtered copper seed layer, and a nickel-based barrier layer. A solder is in direct contact with the UBM stacks, wherein an intermetallic forms at an interface between the UBM stacks and the solder. A liquid etchant is applied to selectively remove one layer at a time of each of the solder, the barrier layer, conductive layer, the adhesion layer and the intermetallic. The polyimide surface is exposed to an oxygen plasma ashing to increase surface roughness thereon. A titanium adhesion layer and copper seed layer is sputter deposited onto the bond pad and the polyimide. A photoresist is applied, exposed, and developed on the titanium-based adhesion layer to form a pattern. A copper-based conductor layer and a nickel-based barrier layer are plated onto the exposed portion of the titanium-based adhesion layer with a top copper-based seed layer in the pattern. Etching the layers reforms the UBM stack.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
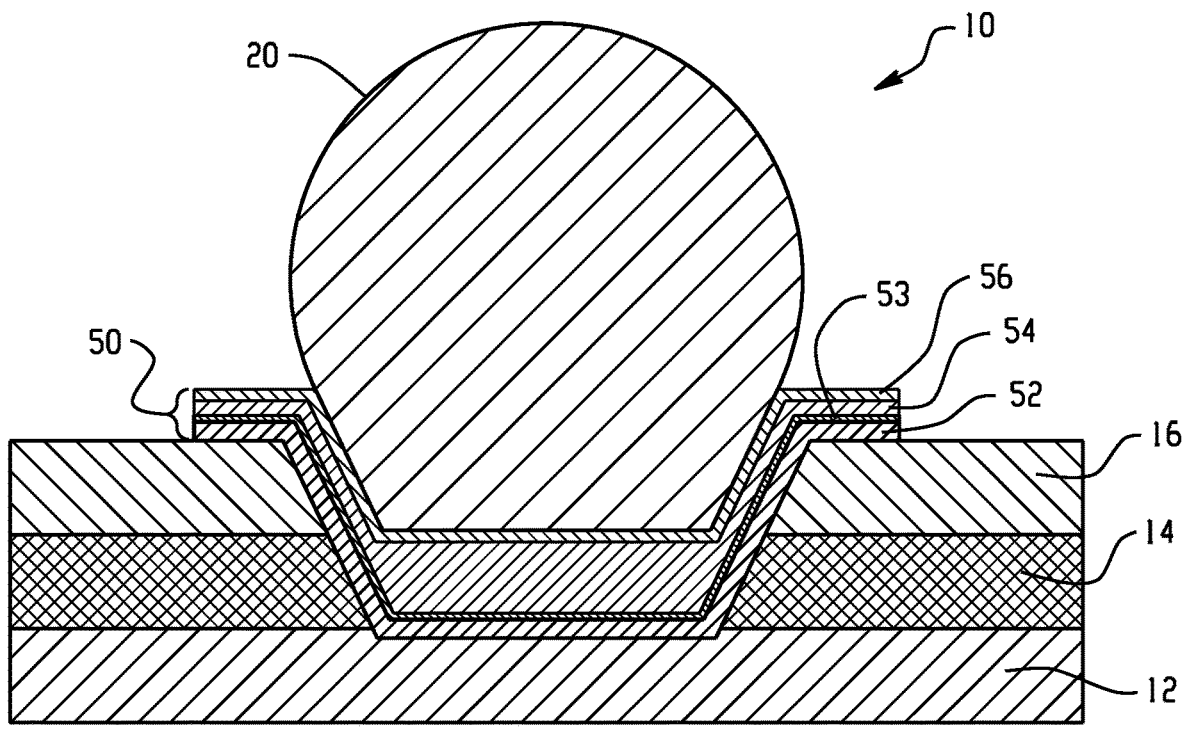
FIG. 1 schematically illustrates a cross sectional view of an exemplary flip chip including a solder ball in accordance with one or more embodiments of the present invention.

Flip chip fabrication generally includes several sequential steps including preparing the wafer for solder bumping, forming or placing the solder bumps, attaching the bumped die to a board, substrate, or carrier, and completing the assembly with an adhesive underfill. In preparing the wafer for solder bumping, the first step is to create a solderable metal surface for each of the input/output (I/O) that serve as an interface between the I/O pad and the solder bump known as under bump metallurgy (UBM). The UBM can be a multilayered thin film between an aluminum bond (I/O) pad, passivation and solder bump. The second step includes forming or placing the solder bumps (i.e., also referred to as solder balls), which provides for both mechanical and electrical connection between the die and the substrate. Following the bumping process, the wafer is diced and finally, the bumped die is "flipped" on the substrate. The bumps connect the die and the substrate, which includes corresponding bond pads, together into a single package.

There are many aspects of the bumping line that can lead to otherwise good parts being scrapped. For example, testing can indicate the presence of shorts. Removal of the shorts requires removal of the solder as it cannot be present during reapplication of the passivation layers. Moreover, there is a desire to mix and match technologies to enable more unique heterogenous integration solutions. In order to address these issues, it is necessary to remove the solder bumps, intermetallics, and under bump metallurgy on the individual dies, wafers and/or substrates without damaging the exposed aluminum pads or undercutting the solder mask. The present invention provides a rework process that generally includes selective removal of one metal layer at a time from the dies, wafers and substrates using various liquid metal etchant compositions, e.g., in the case of dies and wafers selective removal of a C4 solder ball and the various layers defining the underball metallurgy or in the case of the substrate, the removal of the solder defining the corresponding pads. The various metal etchant compositions provide selective removable without damaging the underlying metallurgy or the dielectric. In one or more embodiments, the rework process can include selective removal of the underlying soft dielectric layer, e.g., a polyimide layer.

The dies, wafers and/or substrates can then be rebumped/resoldered as indicated as an individual part or in conjunction with a fan in line where the individual components are re-constituted into a wafer or panel and then processed as the larger entity for which the manufacturing line was designed.

As will be described in greater detail, selective removal of one metal layer at a time removes a targeted metal layer without damaging exposed surfaces corresponding to other layers and/or materials. For wafer and die applications, subsequent recovery can include utilizing redistribution layer plating and passivation techniques followed by solder re-plating using C4 methodology. For individual dies, the dies can either be plated individually or reconstituted into a wafer or panel and then processed through a standard manufacturing line. Advantageously, the recovered dies, wafers and/or substrates can be modified as desired to permit the use of off-the-shelf components to simplify packaging designs. For example, the reworked die or wafer can be reconfigured with a redistribution layer to provide use with components from different manufacturers that may have a different joint configuration.

Detailed embodiments of the chip packaging structures and the rework processes of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in packaging applications including other semiconductor devices and wiring levels, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

The term "solder" as used herein, refers to any metal or metallic compound or alloy that is melted and then allowed to cool in order to join two or more metallic surfaces together. Generally speaking, solders have melting temperatures in the range of about 138° C. to about 325° C. The solder used in bump connections can be made from lead-free solder mixtures such as a tin-copper solder or lead based solder mixtures such as a lead-tin solder.

The term "intermetallic" refers to a metallic alloy formed during a reaction between an under bump metallization (UBM) layer and the solder used for forming the solder bumps. For example, tin is typically used in the solder material and can react with copper or nickel in the UBM to form a copper-tin intermetallic compound or a nickel-tin intermetallic compound, respectively.

In the present invention, the rework process generally includes selectively removing each metal layer including the intermetallic from the flip chip joint and its UBM using various etchant compositions exhibiting high selectivity. If necessary, the solder mask, e.g., the polyimide layer, can also be removed.

The UBM is a solder wettable terminal metallurgy that can be multilayered. The UBM generally defines the size and area of the soldered connection between the solder ball and the component that the solder ball is to be placed in electrical communication with. The UBM limits the flow of the solder ball to the desired area.

A typical plated UBM structure can include a metal stack including a sputtered titanium or titanium-tungsten alloy adhesive layer, a sputtered copper conductive layer, a plated nickel barrier layer. The UBM provides a path for interconnection between the device back end of line structures, and the electrical structures to be connected to the device back end of the line structures, using a solder bump.

The electrical structures to be connected to the device back end of the line structures can include a packaging substrate, which can be a ceramic packaging substrate, a laminate packaging substrate, or any other type of packaging substrate as known in the art and may contain wiring structures therein that are configured to electrically conductive paths through the first substrate. In this case, the at least one electrical component can be wiring structures that provide electrical connections through the packaging substrate.

Turning now to FIG. 1, there is depicted a cross sectional view of an exemplary integrated flip chip package 10 including a solder ball 20 and UBM stack 50 in accordance with various embodiments of the present invention. The UBM stack 50 can be provided in a trench defined in an aluminum layer 12, a passivation layer 14, and a polyimide layer 16. The aluminum layer 12 provides one example of a line to an electrical component that may be present in/or on a substrate (not shown). In one or more embodiments, the aluminum layer 12 may be in electrical communication with the back end of line (BEOL) line structures, vias, semiconductor devices, memory devices, diodes, capacitors, and other electrical devices that may be present in the substrate.

In one or more embodiments, the base material of the substrate may be any material that provides a semiconductor wafer, such as, silicon (Si), strained Si, silicon doped with carbon (Si:C), silicon germanium (SiGe), silicon germanium doped with carbon (SiGe:C), Si alloys, germanium (Ge), Ge alloys, gallium arsenic (GaAs), indium arsenic (InAs), and indium phosphorus (InP), as well as other III/V and II/VI compound semiconductors. In one or more embodiments, the substrate may be a ceramic material.

The aluminum layer 12 is only one example of a metallurgical composition for the electrical component that the UBM stack 50 can contact. For example, instead of being composed of aluminum, the conductive feature that is identified by reference number 12 can be composed of other metals, such as tungsten (W), platinum (Pt), copper (Cu), silver (Ag), or can be composed of electrically conductive doped semiconductor materials.

The passivation layer 14 can be composed of an oxide, nitride or oxynitride dielectric. In one or more embodiments, when the passivation layer 14 is composed of an oxide, the passivation layer 14 can be composed of silicon oxide ($SiO_2$ or hafnium oxide ($HfO_2$). In one or more other embodiments, when the passivation layer 14 is composed of a nitride, the passivation layer 14 can be composed of silicon nitride ($Si_3N_4$); and when the passivation layer 14 is composed of an oxynitride, the passivation layer 14 may be composed of silicon oxynitride.

The polyimide layer 16 is an organic passivation layer that is present on the passivation layer 14. In one or more embodiments, the organic passivation layer that provides the polyimide layer 16 is benzo-cyclobutene (BCB). In one or more other embodiments, the organic passivation layer that provides the polyimide layer 16 is a photosensitive polyimide (PSPI). It is noted that other materials may also be suitable for use in the polyimide layer 16, which can have useful mechanical properties that make them suitable as stress buffer passivation layers to improve device reliability by eliminating stresses that may be introduced during packaging operations. The polyimide layer 16 may be formed by a deposition process, such as spinning from solution, spraying from solution, chemical vapor deposition (CVD), plasma enhanced CVD (PECVD), evaporation and combinations thereof. In one or more embodiments, the polyimide layer 16 can have a thickness ranging from about 1 micron to about 15 microns. In one or more other embodiments, the polyimide layer 16 has a thickness of about 7 microns; and in still one or more other embodiments, the thickness of the polyimide layer 16 may range from about 12 microns to about 20 microns when acting as a stress buffer passivation layer.

Those of skill in the art will understand that the layers identified by reference numbers 12, 14 and 16 can include other combinations of material layers.

The trench to the aluminum layer 12 typically dictates the dimensions of the contact pad to the electrical component that is present in the substrate. In some embodiments, the trench that is formed through the polyimide layer 16 and the passivation layer 14 has a width (e.g., diameter) ranging from about 5 microns to about 100 microns. In another embodiment, the trench that is formed through the polyimide layer 16 and the passivation layer 14 has a width ranging from 25 microns to 75 microns. In one example, the trench has a width on the order of 50 microns. The aspect ratio of height to opening width of the trench is typically about 1:1, e.g. within the range of 0.75:1 to 1.5:1. In one example, the aspect ratio (thickness to opening) for filling the trench can be 0.5:1. The opening provided by the trench to the aluminum layer 12 may be dependent upon the solder bump (C4) size being plated and, in some embodiments, may be reduced to a width of about 25 microns or about 5 microns for some advanced applications. It is noted that the above dimension are provided for illustrative purposes only and are not intended to limit the present disclosure, as other dimensions have been contemplated and are equally applicable to the methods and structures disclosed herein. Additionally, some structures may only have a polyimide layer 16 without the passivation layer 14, or a passivation layer 14 without a polyimide layer 16 or the order of the passivation layer and the polyimide layer can be reversed.

The UBM stack 50 in the exemplary integrated flip chip package 10 includes a metallic adhesion layer 52, that is in direct contact with the contact pad defined by the aluminum layer 10 to the electrical component, a conductive layer 54 that is in direct contact with the metallic adhesion layer 52, and a barrier layer 56 in direct contact with the conductive layer 52, which collectively define the UBM. An electrically conductive solder bump 20 is disposed above and on the UBM stack. An intermetallic is typically formed between the solder bump 20 and the UBM stack, e.g., $Cu_xSn_y$.

The exemplary integrated circuit 10 is not intended to be limited to the depicted structure. Additional layers and/or configurations are contemplated. For example, in one or more embodiments, the UBM stack 50 can include a copper seed layer intermediate the metal adhesion layer 52 and the copper conductive layer 54. In another example, the UBM stack 50 may include a second nickel (Ni) barrier layer and a second copper (Cu) conductor layer present on the second nickel (Ni) barrier layer 56.

The term "direct contact" means that a first element, such as a first structure, and a second element, such as a second structure, are connected without any intermediary conducting, insulating or semiconductor layers at the interface of the two elements. The terms "on" and "positioned on" means that a first element, such as a first structure, is present on a second element, such as a second structure, wherein intervening elements, such as an interface structure, e.g. interface layer, may be present between the first element and the second element.

The metallic adhesion layer 52 may be composed of titanium-tungsten (TiW) alloy, a chrome-copper (Cr—Cu) alloy or another alloy having adhesion properties that includes at least one of tantalum (Ta), chrome (Cr), copper (Cu), titanium (Ti) or tungsten (W). In the example that is depicted in FIG. 1, the metallic adhesion layer 52 is composed of a TiW alloy layer that is in direct contact with the exposed portion of the aluminum layer 10 that is exposed by the trench. In one embodiment, the titanium TiW layer is composed of 5 at. % to 50 at. % titanium and 95 at. % to 50 at. % tungsten.

In one or more embodiments, the metallic adhesion layer 52 can have a thickness ranging from about 1000 Angstroms (Å) to about 5000 Å. In one or more other embodiments, the metallic adhesion layer 52 has a thickness ranging from about 1250 Å to about 4500 Å, and in still one or more other embodiments, the metallic adhesion layer 52 has a thickness ranging from about 2000 Å to about 4000 Å.

The conductor layer 54 can be a copper conductor composed of 95 at. % or greater copper (Cu). In one or more embodiments, the conductor layer 54 is 99 at. % or greater Cu and in one or more other embodiments, the Cu conductor layer 54 is composed of 100 at. % Cu. It is noted that the above compositions for the conductor layer 54 are provided for illustrative purposes only and are not intended to limit the present invention. The conductor layer 54 can have a thickness ranging from 0.25 microns to 35 microns. In one or more other embodiments, the conductor layer 54 has a thickness ranging from about 5 microns to about 10 microns, and in still one or more other embodiments, the Cu conductor layer 54 may be omitted.

In one or more embodiments, a Cu seed layer 53 must be formed in direct contact with the metallic adhesion layer 52 prior to deposition of the conductor layer 54. The Cu seed layer provides improved adhesion of the conductor layer 54 to prevent delamination during subsequent processing as well as to provide uniform current during electrolytic plating. The Cu seed layer 53 may be composed of 95 at. % or greater Cu. In one example, the Cu seed layer is about 97 at. % or greater Cu. In yet another example, the Cu seed layer is composed of 100 at. % Cu. The Cu seed layer is typically deposited using a physical vapor deposition (PVD) method, such as sputtering. The Cu seed layer may have a thickness ranging from about 1500 Å to about 6000 Å. In one or more other embodiments, the Cu seed layer has a thickness ranging from about 2000 Å to about 4500 Å. In one example, the Cu seed layer has a thickness ranging from about 2000 Å to about 4000.

The barrier layer 56 can be composed of about 50 at. % to 100 at. % nickel (Ni). In one or more embodiments, the barrier layer 56 is composed of greater than about 99 at. % Ni and in one or more other embodiments, Ni barrier layer 56 is 100 at. % Ni. In one or more embodiments, the barrier layer 56 includes an alloy of Ni and at least one alloying element selected from the group consisting of cobalt (Co), iron (Fe) or a combination thereof, wherein the alloying element can be present in the Ni barrier layer 56 in a concentration ranging from about 5 at. % to about 50 at. %. It is noted that the above compositions for the barrier layer 56 are provided for illustrative purposes only and are not intended to limit the present invention.

The barrier layer composition has a lesser reaction rate with the metallic elements of the later formed solder ball than the reaction rate of copper with the metallic elements of the later formed solder ball. In this manner, the nickel-based barrier layer 56 protects the copper-based conductor layer 54 from being consumed by interaction with elements from that diffuse towards the copper-based conductor layer 54 from the later formed solder bump as the result of electromigration in high current applications.

The solder ball 20 as shown in FIG. 1 is in direct contact with the barrier layer 56 of the UBM stack 50. The solder ball 20 can be a lead-free solder or a lead-based solder.

In one or more embodiments, a lead-free solder ball 20 may include a tin copper (Sn—Cu) alloy, a tin silver (Sn—Ag) alloy, or a tin copper silver (Sn—Cu—Ag) alloy. More generally, the solder composition can be an alloy with a minimum of about 65% Sn and additives, such as Cu, Ag, Bi, Co, and Ni, such that the additives constitute the balance of the solder composition. When copper is present in the alloy that provides the solder ball 20, the copper may be present in an amount ranging from about 0.1 atomic weight percent (at. %) to about 2 at. %. In one embodiment, the copper content within the solder ball 20 may range from about 0.1 at. % to about 1 at. %. In one or more embodiments, the concentration of copper that is present in the solder ball is about 0.7 at. %. When silver is present in the alloy that provides the solder ball 20, the concentration of silver is from about 0.5 at. %, to about 3.5 at. %. In one or more embodiments, the silver content in the solder ball 20 may range from about 0.1 at. % to about 3 at. %. In a solder ball 20 including the above concentration of silver and copper, the remainder of the solder ball 20 may be tin.

In one or more embodiments, a lead-based solder ball 20 may include a tin-lead solder. Suitable lead tin solders include the formula $Sn_xPb_y$, wherein x+y is equal to 1 and wherein y is in a range from about 0.3 to about 0.99.

The diameter of the solder ball 20, as measured in the largest horizontal cross-section of the solder ball 20, may be from about 10 microns to about 300 microns. In one or more embodiments, the diameter of the solder ball 20 may range from 90 microns to about 125 microns.

The underlying nickel-based or copper-based layers in the UBM stack 50 can act as a tin absorber to form an intermetallic zone.

Figure 2:
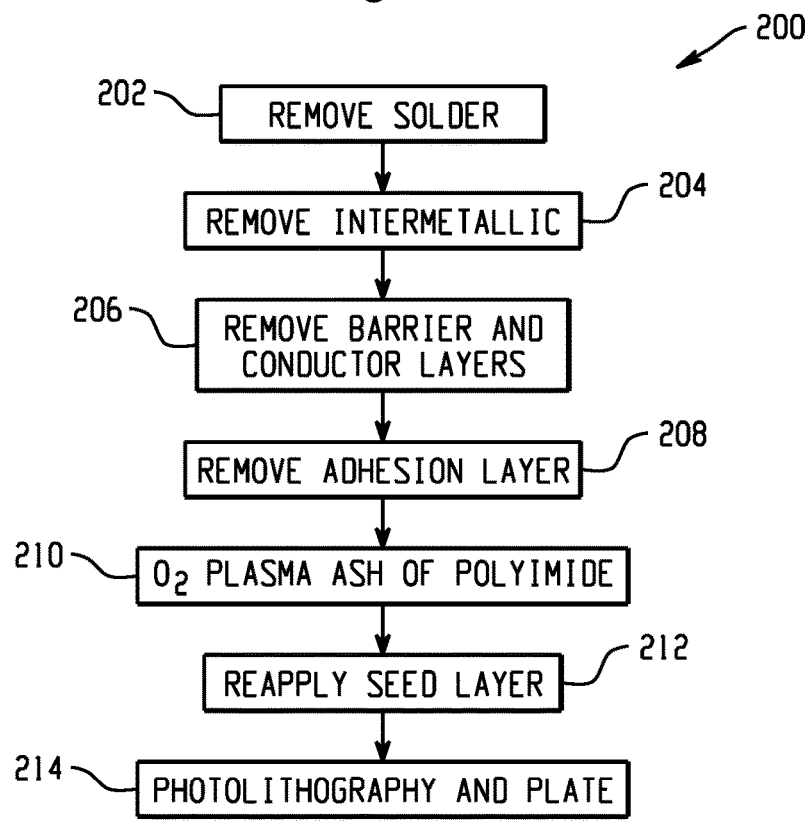
FIG. 2 schematically illustrates a rework and recovery process flow for wafers in accordance with one or more embodiments of the present invention.

Referring now to FIG. 2 there is depicted a rework and recovery process flow for a wafer, generally designated by reference numeral 200, including one or more solder bumps and the UBM stacks as generally described above. However, it should be apparent that the present invention is not intended to be limited to the exemplary UBM described above.

In block 202, the solder bump is first selectively removed using a liquid etchant, which can be sprayed onto the wafer or the wafer immersed therein. For lead-based solders, the process includes contacting the solder with an acetic acid/hydrogen peroxide solution such as for example, a 50% glacial acetic acid and 50% hydrogen peroxide (35 wt % solution) at room temperature (25° C.) and for a period of 10 minutes (min) effective to completely remove the solder. For lead-free solders such as a tin based alloy as described above, the solder is removed by contacting the solder with a 20% nitric acid solution at a temperature and for a period effective to completely remove the solder. The solution can range from about 10% nitric acid to about 35% nitric acid. The time ranges from 50 min for the former and 2 min for the latter for a 185.6 um pitch solder bump when applied at room temperature (25° C.). For a 20% nitric acid solution at 25° C., the time varies between 5 min to 30 min as the size of the solder bump varies from 10 um pitch up to 1.0 mm pitch. Advantageously, the use of the acetic acid/hydrogen peroxide solution or the nitric acid solution, while effective for removal of the solder bump, does not attack the underlying layers in the UBM.

In block 204, once the solder bump is selectively removed, a chloride-based or bromide-based nitric acid solution is used to remove any intermetallics resulting from the previous joining of the solder to the UBM. Removal of the intermetallic is necessary for wafers that had previously been reflowed so as to promote the formation of the intermetallic. The chloride-based solution consists of 20% $HNO_3$ and 10% HCl solution. The bromide-based solution consists of 10% $HNO_3$ and 200 g/L $NiBr_2$ solution. For example, spraying or immersing the intermetallic layer in a chloride-based or bromide-based 10% nitric acid solution at room temperature for a period of 2 to about 10 minutes can be used to remove the intermetallic layer. The chloride-based or bromide-based nitric acid solution does not attack and remove the Ti-based underlayers.

In block 206, the process includes contacting the nickel-based barrier layer and the copper-based conductor layers with a 20% nitric acid solution at a temperature and for a period of time effective to completely these layers so as to expose the underlying titanium-based adhesion layer. The underlying titanium-based adhesion layer is substantially inert to the liquid etchant for removing the nickel-based barrier layer and the cooper-based conductor layer.

In block 208, the process includes contacting the titanium-based adhesion layer with a non-halogen such as fluoride-based liquid etchant. The particular non-halogen based liquid etchant is not intended to be limited and will generally depend on the composition of the titanium-based adhesion layer. By way of example, the non-halogen based liquid etchant can include a solution of hydrogen peroxide, a salt of EDTA and an acid to remove a titanium-tungsten adhesion layer. Another typical hydrogen peroxide solution would consist of 110 g/L $H_2O_2$, 0.05 M $H_3PO_4$, pH adjusted to circa 8.5 to 9.0, temperature between 35 to 38° C. and times close to 6 min.

In block 210, the exposed polyimide surface and aluminum pad surface is then exposed to an oxygen ashing process to increase the surface roughness and to remove any film/oxide from the surface of the Al layer thereon so as to improve adhesion of the UBM when redeposited during recovery. Optionally, the polyimide layer can be completely removed, if desired. In the event the polyimide layer is removed by the oxygen ashing process, the polyimide layer is reapplied, patterned, and then subjected to the oxygen ashing process to improve adhesion of the UBM.

In block 212, titanium or titanium tungsten seed layers are then sputtered onto the aluminum pads to form the adhesion layer. As used herein, "sputtering" means a method of depositing a film of material on a semiconductor surface. A target of the desired material, i.e., source, is bombarded with particles. e.g., ions, which knock atoms from the target, and the dislodged target material deposits on the deposition surface. Examples of sputtering techniques suitable for depositing the seed layer but are not limited to DC diode sputtering ("also referred to as DC sputtering"), radio frequency (RF) sputtering, magnetron sputtering, and ionized metal plasma (IMP) sputtering.

In block 214, the copper conductor layer, nickel-based barrier layers and solder are plated onto the titanium-based adhesion layer and copper layer using photolithography, for example, by applying, exposing, and developing a photoresist (not shown) to form a pattern, followed by plating and etching to form the desired UBM stack. Following etching, the photoresist may then be removed.

Figure 3:
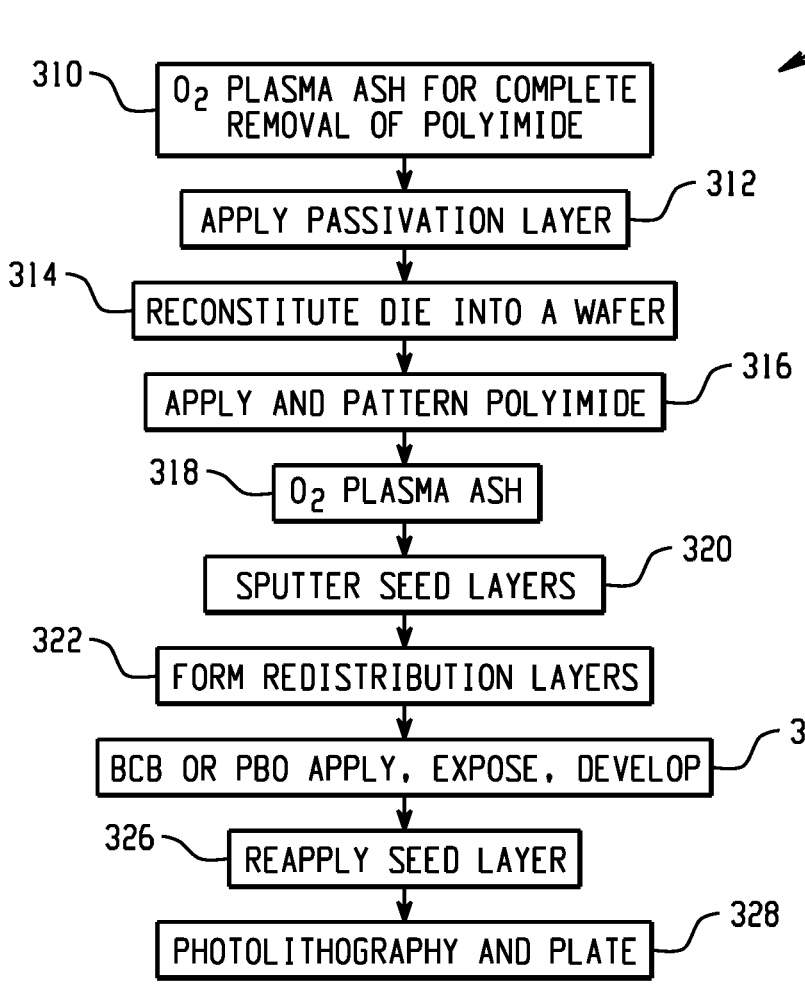
FIG. 3 schematically illustrates a rework and recovery process flow for dies in accordance with one or more embodiments of the present invention in accordance with one or more embodiments of the present invention.

Referring now to FIG. 3, there is depicted a rework and recovery process flow for a die, generally designated by reference numeral 200, including one or more solder bumps and the UBM stacks as generally described above. The process is similar to the rework process of the wafer as described above. For example, the solder on the die is first removed by applying a liquid etchant as previously described. For lead based solders, the solder is removed using an acetic acid/hydrogen peroxide solution, and for the lead-free solders, the solder is removed by contacting the solder with a 20% nitric acid solution at a temperature and for a period of time effective to completely remove the solder. Once the solder is removed, the intermetallic can be removed in a chloride based or bromide-based 10% nitric acid solution for a period of 2 to about 10 minutes. The nickel-based barrier and the copper-based conductor layers are then removed using with a 20% nitric acid solution at a temperature and for a period of time effective to completely these layers so as to expose the underlying titanium-based adhesion layer, which is then removed using a non-halogen based liquid etchant as described above.

In block 310, the polyimide layer is completely removed from the die by an oxygen plasma ashing process. A nitride passivation layer is then applied to fully passivate the top surface as shown in block 312.

In block 314, the die is then reconstituted into a wafer format using an overmold material. For example, multiple dies are placed face down onto a carrier as a set periodicity from each other. An epoxy material is then used to cover the individual die and form them into a single entity such as a circle or rectangle. If the desire is to make a wafer, the entity is a wafer of a standard size such as 200 mm or 300 mm and a standard thickness such as 775 um for a 300 mm wafer. In this way, standard manufacturing equipment can be used to process the wafer.

In block 316, a polyimide layer is deposited onto the nitride passivation layer and patterned to expose the aluminum pads.

In block 318, the polyimide and the exposed aluminum pad surface are subjected to a directional etch process such as, for example, a reactive ion etch (RIE) process to remove the nitride followed by an oxygen plasma ashing process so as to improve adhesion of additional layers deposited onto the polyimide layer.

In block 320, the seed layers defining the titanium-based adhesion layer followed by copper-based conducting layers are then sputtered onto the aluminum pads and polyimide.

In block 322, redistribution layers of a copper conductive metal can be plated in contact with the titanium-based adhesion layer and copper-based conducting layer. The redistribution layer can be used to move the bond pad around the face of the die, permit die stacking if desired, or move the bond pads of a device to a position more convenient or accessible for subsequent bonding and packaging steps. For example, this may include matching the layout of an old die that is not longer being supported and must be replaced by a newer design or replaced with a similar die albeit from a different manufacturer.

The reconstituted die is then subjected to strip, seed etch, and ash to remove the shorting layer that resist layers needed to define and plate the copper redistribution layer.

In block 324, the reconstituted die is subjected to re-passivation of a dielectric layer such as benzocylobutene (BCB) or polybenzoxazole (PBO) that is patterned and developed to open a new bond pad on the redistribution layer. The major benefit of PBO is that it has a reduced curing temperature and reduces the impact on the performance/quality of the reconstituted die. The BCB by contrast has better electrical properties and reduced modulus that improve both electrical performance and reliability but at the impact of higher cure temperatures that could damage the die.

In block 326, seed layers forming the titanium-based adhesion layer are then applied.

In block 328, the copper conductor layer, nickel-based barrier layers and solder are plated onto the titanium-based adhesion layer and copper conducting layer using photolithography, for example, by applying, exposing, and developing a photoresist (not shown) to form a pattern, followed by plating and etching to form the desired UBM stack. Following etching, the photoresist may then be removed.

Figure 4:
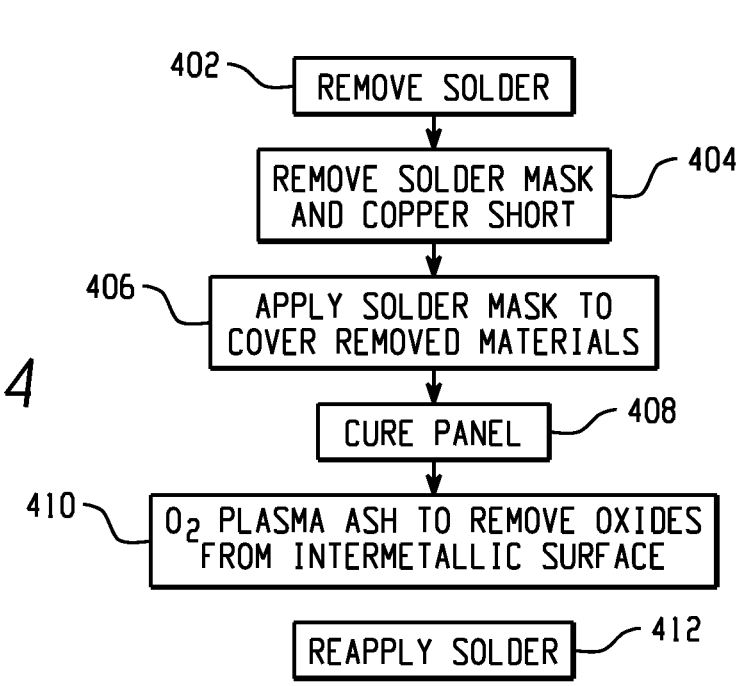
FIG. 4 schematically illustrates a rework and recovery process flow for panels or substrates in accordance with one or more embodiments of the present invention in accordance with one or more embodiments of the present invention.

Referring now to FIG. 4, the rework process flow for panels and laminates 400 is shown. In block 402, the solder is first selectively removed using a liquid etchant, which can be sprayed onto the panel/laminate or the panel/laminate immersed therein. For lead-based solders, the process includes contacting the solder with an acetic acid/hydrogen peroxide solution of 50% glacial acetic acid and 50% hydrogen peroxide (35 wt % solution) at room temperature (25° C.) and for a period of 10 min effective to completely remove the solder. For lead-free solders such as a tin based alloy as described above, the solder is removed by contacting the solder with a 20% nitric acid solution at a temperature and for a period of time effective to completely remove the solder. The solution can range from about 10% nitric acid to about 35% nitric acid. The time ranges from 50 min for the former and 2 min for the latter for a 185.6 um pitch solder bump when applied at room temperature (25° C.). For a 20% nitric acid solution at 25° C., the time varies between 5 min to 30 min as the size of the solder bump varies from 10 um pitch up to 1.0 mm pitch.

In block 404, a laser etch is used to selectively remove the solder mask, i.e., the polyimide and passivation layers, and the copper short.

In block 406, a liquid solder mask is used to cover the exposed surfaces defined by the removed materials. The solder mask can be a dielectric material.

In block 408, the liquid solder mask is cured between 220° C. and 300° C. for 60 sec to 6 minutes.

In block 410, the cured solder mask panel or laminate is subjected to an oxygen plasma ash process in an inert gas such as argon to remove oxides from intermetallic surface, e.g., a copper tin surface.

In block 412, screening technology as is known in the art or a solder ball drop process can be used to reapply the pre-solder, which is then heated to form a solder ball.

The descriptions of the various embodiments of the present invention have been presented for purposes of illustration and are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A process for reworking and recovering a die for a flip chip application, the process comprising:
   providing the die comprising a plurality of under-bump metallurgy (UBM) stacks on a substrate, wherein each of the UBM stacks is in contact with a first bond pad and is formed in a trench to the first bond pad defined by a passivation layer and a polyimide layer, wherein each of the UBM stacks comprises a sputtered adhesion layer including a seed layer thereon, a plated conductive layer, and a barrier layer; and solder in direct contact with the UBM stacks, wherein an intermetallic forms at an interface between each of the UBM stacks and the solder;
   applying a liquid etchant to selectively remove one layer at a time each of the solder, the barrier layer, the plated conductive layer, and the sputtered adhesion layer;
   removing the polyimide layer;
   depositing a nitride layer;
   depositing and patterning a photosensitive polyimide layer to expose the first bond pad;
   depositing and patterning a redistribution layer extending from the first bond pad to a second bond pad at a different location;
   depositing and patterning a passivation layer to expose the second bond pad; and
   forming a second UBM stack and a second solder ball thereon on the second bond.

2. The process of claim 1, wherein the sputtered adhesion layer comprises a titanium-based metal; the seed layer comprises copper; the plated conductive layer comprises a copper-based metal; and the barrier layer comprises a nickel-based metal.

3. The process of claim 1, wherein the solder is lead free.

4. The process of claim 3, wherein applying the liquid etchant for removing the lead-free solder comprises spraying or immersing the solder in a solution comprising nitric acid.

5. The process of claim 1, wherein the solder is lead-based.

6. The process of claim 5, wherein applying the liquid etchant for removing the lead-based solder comprises spraying or immersing the solder in a solution comprising acetic acid and hydrogen peroxide.

7. The process of claim 2, wherein applying the liquid etchant for removing the sputtered adhesion layer comprises spraying or immersing the adhesion layer in a halogen-free solution.

8. The process of claim 2, wherein applying the liquid etchant for removing the plated conductive and the barrier layers comprises spraying or immersing the conductive and the barrier layers in a solution comprising nitric acid.

9. The process of claim 2, wherein applying the liquid etchant for removing the intermetallic comprises spraying or immersing the intermetallic in a solution comprising a chloride-based or bromide-based nitric acid solution.

10. The process of claim 2, wherein the titanium-based adhesion layer comprises titanium-tungsten composed of 5 at. % to 50 at. % titanium and 95 at. % to 50 at. % tungsten.

11. The process of claim 2, wherein the plated copper-based conductor layer comprises copper within a range of 95 at. % to 100 at. %.

12. The process of claim 2, wherein the nickel-based barrier layer comprises nickel within a range of 50 at. % to 100 at. % nickel (Ni).

13. A process for reworking and recovering a substrate for a flip chip application, the process comprising:
   applying a liquid etchant to selectively remove solder from the substrate;
   removing a solder mask and a copper short;
   applying and patterning a solder mask;
   curing the substrate;
   exposing the solder mask to an oxygen plasma ash process to roughen a surface thereof; and
   reapplying solder to the substrate.

14. The process of claim 13, wherein the substrate comprises a ceramic packaging substrate or a laminate packaging substrate.

15. The process of claim 13, wherein the solder mask comprises a photosensitive polyimide.

16. The process of claim 13, wherein the solder comprises an under-bump metallurgy (UBM) stack and removing the solder comprises removing one layer of the UBM stack at a time.

17. The process of claim 13, wherein the UBM stack comprises a sputtered titanium-based adhesive layer; a copper conducting seed layer; a plated copper-based conductive layers; and a nickel-based barrier layer.

18. A process for reworking and recovering a wafer for a flip chip application, the process comprising:
   providing the wafer comprising a plurality of under-bump metallurgy (UBM) stacks, wherein each of the UBM stacks is in contact with a bond pad and is formed in a trench opening in a passivation layer and a polyimide layer to the bond pad, wherein each of the UBM stacks comprises a titanium-based adhesion layer, a copper-based conductive layer, a sputtered copper seed layer, and a nickel-based barrier layer; and a solder in direct contact with the UBM stacks, wherein an intermetallic forms at an interface between the UBM stacks and the solder;
   applying a liquid etchant to selectively remove one layer at a time each of the solder, the nickel-based barrier layer, the copper-based conductive layer, the titanium based adhesion layer and the intermetallic;
   oxygen plasma ashing the polyimide surface to increase surface roughness thereon;
   sputter depositing a titanium adhesion layer and a copper based seed layer onto the bond pad and the polyimide;
   applying, exposing, and developing a photoresist onto the titanium-based adhesion layer to form a pattern;
   plating a copper-based conductor layer and a nickel-based barrier layers onto the exposed portion of the sputtered copper-based seed layer and titanium-based adhesion layers in the pattern; and
   etching the copper-based conductor layer and the nickel-based barrier layer to reform the UBM stack.

19. The process of claim 18, wherein applying the liquid etchant for removing the adhesion layer comprises spraying or immersing the adhesion layer in a halogen-free solution.

20. The process of claim 18, wherein applying the liquid etchant for removing the conductive and the barrier layers comprises spraying or immersing the copper-based conductive layer and the nickel-based barrier layers in a solution comprising nitric acid.

* * * * *